US006922822B2

(12) United States Patent
Frank et al.

(10) Patent No.: US 6,922,822 B2
(45) Date of Patent: Jul. 26, 2005

(54) VERIFYING PROXIMITY OF GROUND VIAS TO SIGNAL VIAS IN AN INTEGRATED CIRCUIT

(75) Inventors: Mark D. Frank, Longmont, CO (US); Jerimy Nelson, Ft. Collins, CO (US); Peter Shaw Moldauer, Wellington, CO (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 210 days.

(21) Appl. No.: 10/199,668

(22) Filed: Jul. 19, 2002

(65) Prior Publication Data

US 2004/0015796 A1 Jan. 22, 2004

(51) Int. Cl.[7] .............................................. G06F 17/50
(52) U.S. Cl. ............................................. 716/4; 716/5
(58) Field of Search ..................................... 716/4, 5, 2

(56) References Cited

U.S. PATENT DOCUMENTS

| | | | | |
|---|---|---|---|---|
| 5,315,535 A | * | 5/1994 | Kikuchi et al. ................ 716/15 |
| 5,383,132 A | | 1/1995 | Shinohara et al. ........... 364/491 |
| 5,481,695 A | | 1/1996 | Purks .......................... 395/500 |
| 5,510,998 A | | 4/1996 | Woodruff et al. ............ 364/489 |
| 5,559,718 A | | 9/1996 | Baisuck et al. .............. 364/491 |
| 5,568,395 A | * | 10/1996 | Huang ............................ 716/4 |
| 5,590,049 A | | 12/1996 | Arora .......................... 364/489 |
| 5,663,891 A | | 9/1997 | Bamji et al. ................. 364/490 |
| 5,729,466 A | | 3/1998 | Bamji ......................... 364/488 |
| 5,831,867 A | * | 11/1998 | Aji et al. ........................ 716/4 |
| 5,896,300 A | | 4/1999 | Raghavan et al. ........... 364/491 |
| 5,953,518 A | | 9/1999 | Sugasawara et al. ........ 395/500 |
| 6,101,621 A | * | 8/2000 | Kondo ......................... 714/724 |
| 6,182,258 B1 | | 1/2001 | Hollander ................... 714/739 |
| 6,282,693 B1 | | 8/2001 | Naylor et al. ................. 716/8 |
| 6,289,489 B1 | * | 9/2001 | Bold et al. ..................... 716/1 |
| 6,301,693 B1 | | 10/2001 | Naylor et al. ................. 716/10 |
| 6,311,318 B1 | | 10/2001 | Souef et al. .................. 716/18 |
| 6,324,675 B1 | | 11/2001 | Dutta et al. ................... 716/13 |
| 6,336,206 B1 | | 1/2002 | Lockyear ....................... 716/7 |
| 6,363,520 B1 | | 3/2002 | Boubezari et al. |
| 6,381,730 B1 | * | 4/2002 | Chang et al. .................. 716/5 |
| 6,499,129 B1 | | 12/2002 | Srinivasan et al. |
| 6,536,023 B1 | * | 3/2003 | Mohan et al. ................. 716/5 |
| 6,574,785 B1 | * | 6/2003 | Hasegawa .................... 716/13 |
| 6,581,196 B2 | | 6/2003 | Eisenberg et al. |
| 6,643,831 B2 | * | 11/2003 | Chang et al. .................. 716/4 |
| 6,711,730 B2 | * | 3/2004 | Frank et al. .................. 716/18 |
| 2001/0010090 A1 | | 7/2001 | Boyle et al. ................... 716/2 |
| 2001/0011903 A1 | | 8/2001 | O'Neill et al. |
| 2001/0016933 A1 | | 8/2001 | Chang et al. .................. 716/1 |
| 2001/0052107 A1 | | 12/2001 | Anderson et al. ............. 716/4 |
| 2002/0004931 A1 | | 1/2002 | Stralen ........................ 716/18 |
| 2002/0104063 A1 | * | 8/2002 | Chang et al. .................. 716/4 |
| 2003/0070149 A1 | * | 4/2003 | Mizumasa .................... 716/5 |

OTHER PUBLICATIONS

"Alternate Verilog FAQ," Version 9.13, http://www.angelfire.com/in/verilogfaq/index.html (Jun. 2001).

"Advanced Package Designer," Cadence Design Systems, Inc. (2000).

(Continued)

Primary Examiner—Stacy A. Whitmore

(57) ABSTRACT

Techniques are disclosed for verifying the proximity of ground vias to signal vias in an integrated circuit package design. A package designer creates the package design using a package design tool. A proximity verifier verifies that there is a ground via within a predetermined threshold distance of each specified signal via in the package design. The proximity verifier may notify the package designer of any signal vias which are not sufficiently close to ground vias, such as by providing visual indications of such signal vias in a graphical representation of the package design displayed on a display monitor. In response, the package designer may modify the package model to ensure that all signal vias are sufficiently close to ground vias. The proximity verifier may be implemented as a design rule which may be executed automatically and in real-time by the package design tool.

30 Claims, 11 Drawing Sheets

OTHER PUBLICATIONS

"Advanced Package Engineer," Cadence Design Systems, Inc. (2000).
"What's New in IC Packaging," Cadence Design Systems, Inc. (2000).
"Allegro Designer/Allegro Expert," Cadence Design Systems, Inc. (2001).
"Pacific Numerix Joint Solution With Cadence," Cadence Design Systems, Inc. (1998).
"BSDArchitect New Edition", Mentor Graphics Corporation (2000).
"FastScan V8.9_5 Enhancement Value", Mentor Graphics Corporation (2001).
"FastScan ATPG Tool Suite", Mentor Graphics Corporation (2001).
"FlexTest", Mentor Graphics Corporation (1999).
"TetraMAX ATPG Automatic Test Pattern Generation," Synopsys, Inc. (2001).
"TetraMAX ATPG High–Performance Automatic Test Pattern Generator Methodology Backgrounder," Synopsys, Inc. (1999).

* cited by examiner

VERIFYING PROXIMITY OF GROUND VIAS TO SIGNAL VIAS IN AN INTEGRATED CIRCUIT

CROSS REFERENCE TO RELATED APPLICATIONS

This application is related to the following commonly-owned and concurrently-filed patent applications, each of which is incorporated by reference herein:

an application Ser. No. 10/199,127 entitled "Verifying Proximity of Ground Metal to Signal Traces in an Integrated Circuit,"; and an application Ser. No. 10/199,331 entitled "Inter-Signal Proximity Verification in an Integrated Circuit,".

BACKGROUND

1. Field of the Invention

The present invention relates to integrated circuit design and, more particularly, to techniques for providing sufficient ground return for signal traces in layers of an integrated circuit.

2. Related Art

Integrated circuits (ICs) are becoming increasingly large and complex, typically including millions of individual circuit elements such as transistors and logic gates. As a result of this increased size and complexity, IC designers are increasingly using electronic design automation (EDA) software tools to assist with IC design. Such tools help to manage the complexity of the design task in a variety of ways, such as by allowing ICs to be designed hierarchically, thereby enabling the design to be divided into modules and enabling the design task to be divided among multiple designers in a manner that limits the complexity faced by any one designer.

Various hardware description languages (HDLs) have been developed which allow circuit designs to be described at various levels of abstraction. A description of a circuit according to an HDL (referred to herein as an "HDL model" of the circuit) may, for example, describe a particular circuit design in terms of the layout of its transistors and interconnects on an IC, or in terms of the logic gates in a digital system. Descriptions of a circuit at different levels of abstraction may be used for different purposes at various stages in the design process. HDL models may be used for testing circuits and circuit designs, as well as for fabricating the circuits themselves. The two most widely-used HDLs are Verilog and VHDL (Very High Speed Integrated Circuits (VHSIC) Hardware Description Language), both of which have been adopted as standards by the Institute of Electrical and Electronics Engineers (IEEE). VHDL became IEEE Standard 1076 in 1987 and Verilog became IEEE Standard 1364 in 1995.

EDA tools are typically capable of converting a functional HDL description of a circuit design into a specific circuit implementation. The specific circuit implementation may be represented by a "netlist," which identifies both the elements of the circuit and the interconnections among them. In general, a netlist describes the circuit design in terms of nodes and edges. Each node represents a circuit element and each edge represents an interconnection between two circuit elements. Netlists may describe circuits at various levels of abstraction. A netlist may, for example, describe circuit elements in terms of specific structural components (such as resistors and transistors) or in terms of high-level "cells" that may be decomposed into specific structural components and/or other cells. A netlist may, for example, describe the connections between cells in terms of specific cell-to-cell pin connections.

EDA tools are typically capable of converting a netlist into a physical layout of the circuit. The layout process involves both "placement" (assigning specific coordinates in the circuit layout to each cell) and "routing" (wiring or connecting cells together). The layout produced thereby defines the specific dimensions and coordinates of the gates, interconnects, contacts, and other elements of the circuit. The layout may have multiple layers, corresponding to the layers of the circuit. The layout may be used to form a mask, which in turn may be provided to a foundry to fabricate the integrated circuit itself.

One stage in the process of IC design is package design, which refers to the design of substrates (packages) for interconnecting layers of the IC. An IC typically includes multiple packages interconnected in layers. Each package, in turn, may include multiple layers (also referred to as "planes"). Packages within a single IC may be composed of varying materials having varying electrical properties. Individual signal nets (also referred to herein simply as "nets") in the IC may be distributed across multiple packages. A package design must ensure that signals in the IC have sufficient power and maintain sufficient signal integrity when passing from one layer of the IC to another. As used herein, the term "signal net" (or simply "net") refers to a collection of conductors that are connected to form a complete circuit connecting at least one output to at least one input.

As with IC design more generally, various tools exist for automating aspects of IC package design. Such tools typically provide a graphical user interface through which package designers may visually design the IC package in three dimensions. For example, referring to FIG. 1, a prior art package design system 100 is shown in which a human package designer 116 creates and modifies a model 102 of an integrated circuit package using a package design tool 104. The package designer 116 may, for example, use a keyboard 114 or other input device to provide input 108 to the package design tool 104, in response to which the package design tool 104 may modify the package model 102 and display a graphical representation 106 of the package model 102 (or of particular layers therein) on a display monitor 112. The graphical representation 106 typically displays signal traces as lines on a two-dimensional grid.

The package model 102 may include, for example, information specifying the name, location, and size of each signal trace, ground metal, via, and other elements of the package model 102. The package model 102 is typically stored in a database file in a computer system.

One example of the package design tool 104 is Advanced Package Designer (APD), available from Cadence Design Systems, Inc. of San Jose, Calif. APD is a software program which allows the package designer 116 to model the physical, electrical, and thermal characteristics of the package substrate. An APD package design database (e.g., the package model 102) may be provided to a foundry to be used directly as manufacturing input for fabrication of the designed package.

It is common for package designs to include distinct signal layers and ground layers. For example, package model 102 includes layers 104a–c, including ground layer 104a, signal layer 104b, and ground layer 104c. Although package models typically contain additional layers, only three layers 104a–c are shown in FIG. 1 for ease of illustration. A signal layer (such as layer 104b) typically includes only signal traces (also referred to as signal lines), while a ground layer (such as layers 104a and 104c) typically includes only ground metal, typically arranged either in a grid or in a solid plane. Signal layers and ground layers are often arranged so that each signal layer is located between two ground layers.

A via is a vertical conductor or conductive path which form the interconnection between one layer of an IC and another. Signal traces are connected from one signal layer to another through vias (referred to herein as "signal vias") on each of the signal layers. Because ground layers are typically located between signal layers, a signal trace that passes from one signal layer to another through two signal vias typically travels through an intermediate ground layer. Similarly, ground lines are connected from one ground plane to another through vias (referred to herein as "ground vias") on each of the ground layers. Because signal layers are typically located between ground layers, a ground line that passes from one ground layer to another through two ground layers typically travels through an intermediate signal layer. It is important that there be one or more ground vias sufficiently close to each signal via to ensure an adequate ground return path for signal traces that are connected through the signal vias.

Current package design tools do not automatically verify that there are ground vias sufficiently close to each signal via in a package design. As a result, the human package designer 116 must typically manually verify the proximity of ground vias to signal vias. This is a tedious, time-consuming, and error-prone process.

To verify that one or more ground vias are sufficiently close to each signal via, the package designer 116 may visually inspect the graphical representation 106 to determine whether there is a ground via sufficiently close to each signal via. Signal and ground layers may, for example, be superimposed on each other in the graphical package representation 106. Verifying the proximity of signal vias to ground vias by visually inspecting the graphical package representation 106 may be difficult due to the large number of signal vias and ground vias, as well as to the superimposition of layers on each other, which may obscure features of one layer under the features of the other layer.

Additionally or alternatively, the package design tool 104 may generate textual package property reports 110 which list various properties of the package model 102, such as the locations of signal vias and ground vias in the package model 102. The package designer 116 may attempt to verify the proximity of signal vias to ground vias by inspecting the reports 110. Both of these methods are tedious, time-consuming, and difficult to perform accurately.

What is needed, therefore, are improved techniques for verifying that ground vias are sufficiently proximate to signal vias in an integrated circuit design.

SUMMARY

Techniques are disclosed for verifying the proximity of ground vias to signal vias in an integrated circuit package design. A package designer creates the package design using a package design tool. A proximity verifier verifies that there is a ground via within a predetermined threshold distance of each specified signal via in the package design. The proximity verifier may notify the package designer of any signal vias which are not sufficiently close to ground vias, such as by providing visual indications of such signal vias in a graphical representation of the package design displayed on a display monitor. In response, the package designer may modify the package model to ensure that all signal vias are sufficiently close to ground vias. The proximity verifier may be implemented as a design rule which may be executed automatically and in real-time by the package design tool.

For example, in one aspect, the present invention features a computer-implemented method comprising steps of: (A) identifying a signal via in an integrated circuit design; and (B) determining whether there is at least one signal return path (such as ground metal or power) in the integrated circuit design within a predetermined threshold distance from the signal via. The step (A) may include a step of identifying coordinates of the signal via, and the step (B) may include steps of: (B) (1) identifying coordinates of a first signal return path in the integrated circuit design; and (B) (2) determining whether the signal via coordinates differ from the first signal return path coordinates by more than the predetermined threshold distance. The distance may, for example, be measured as a horizontal distance (e.g., a distance within a particular layer of the integrated circuit design). The distance may, for example, be measured from the center of the signal via or from an edge of the signal via.

The method may, for example, determine whether the signal via coordinates differ from the coordinates of all signal return paths in the integrated circuit design by more than the predetermined threshold distance. The method may be applied to all signal vias in the integrated circuit design. The step (A) may include a step of identifying a plurality of layers in the integrated circuit design containing the signal via, and the step (B) may include a step of determining whether there is at least one signal return path in each of the plurality of layers within the predetermined threshold distance from the signal via.

The method may further include a step of: (C) providing an error indication if it is determined in the step (B) that there is no signal return path in the integrated circuit design within the predetermined threshold distance from the signal via. The error indication may, for example, be a visual indication in a graphical representation of the integrated circuit design.

Other features and advantages of various aspects and embodiments of the present invention will become apparent from the following description and from the claims.

DETAILED DESCRIPTION

Figure 1:
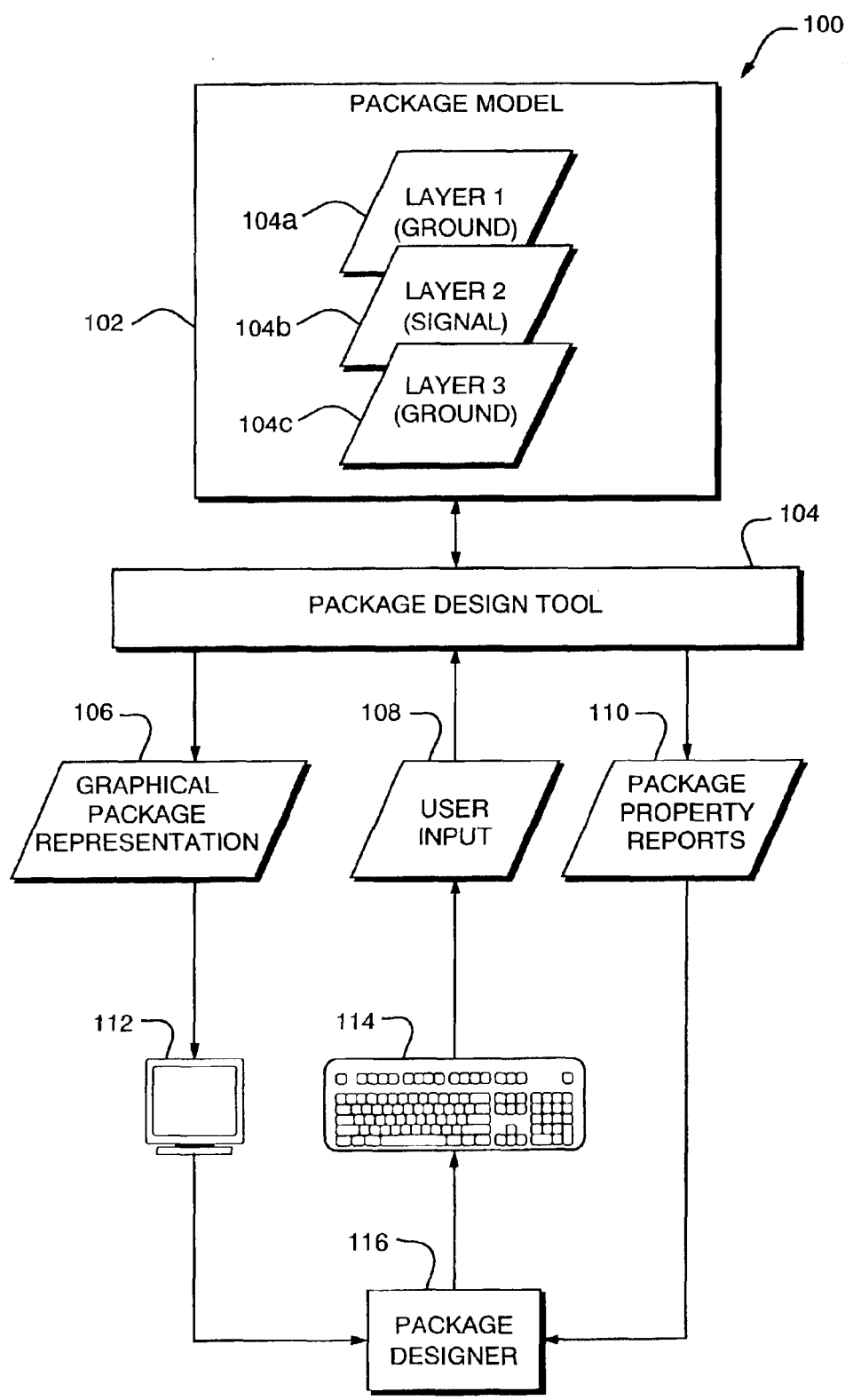
FIG. 1 is a functional block diagram of a prior art system for creating and editing a model of an integrated circuit package.
Figure 2:
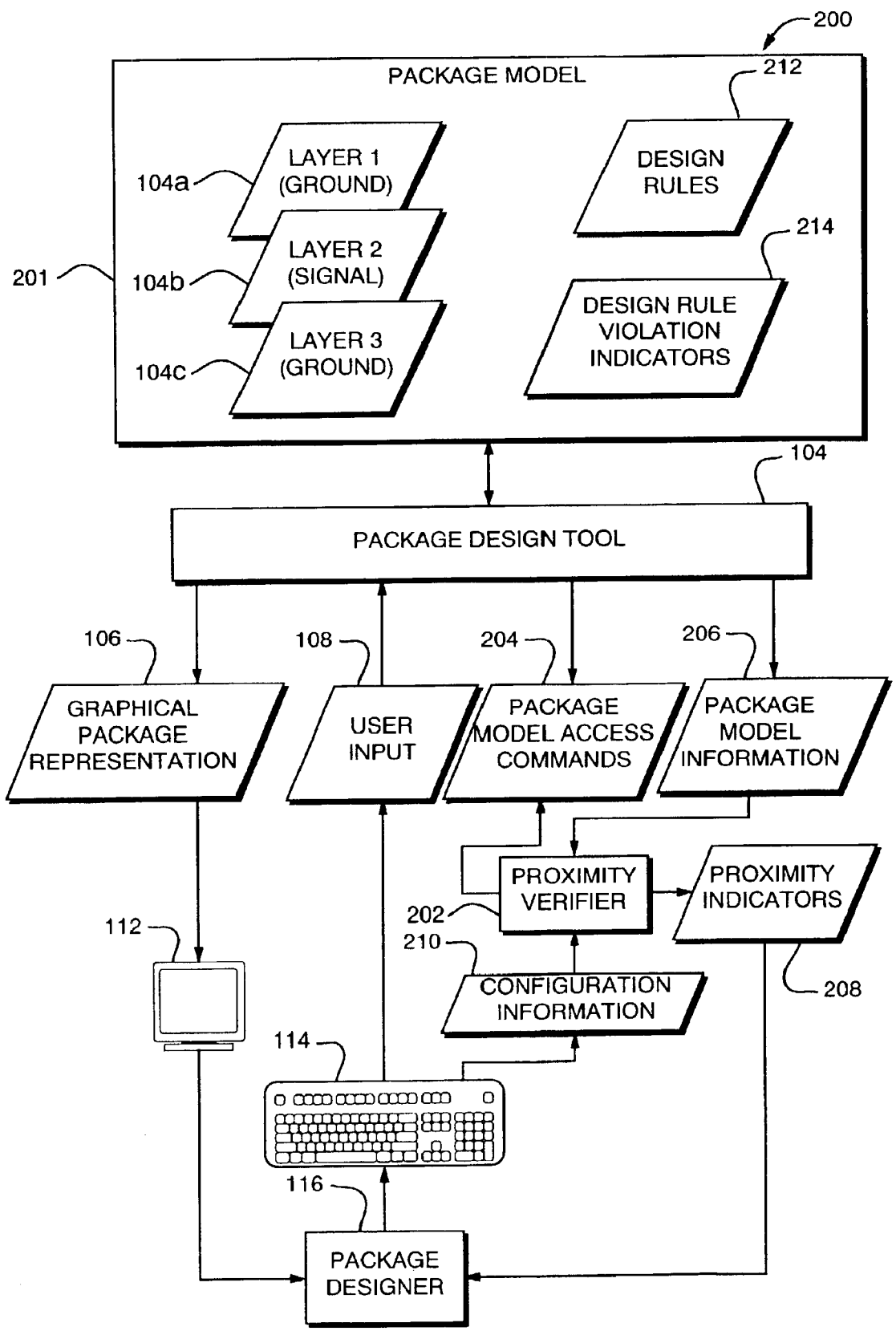
FIG. 2 is a functional block diagram of a system for verifying the proximity of ground vias to signal vias in an integrated circuit package design according to one embodiment of the present invention.

Referring to FIG. 2, a functional block diagram is shown of a system 200 for verifying the proximity of ground vias to signal vias in a model 201 of an integrated circuit package according to one embodiment of the present invention. The system 200 includes package design tool 104 (such as Advanced Package Designer), which may be a conventional package design tool as described above with respect to FIG. 1. The package designer 116 uses the package design tool 104 to create and modify package model 201 as further described above with respect to FIG. 1. The system 200 also includes a proximity verifier 202 for verifying the proximity of ground vias to signal vias in the package model 201. The package designer 116 instructs the proximity verifier 202 to perform verification on the package model 201. The package designer 116 may also transmit configuration information 210, containing parameters of the proximity verification process, to the proximity verifier 202.

The proximity verifier 202 transmits package model access commands 204 to the package design tool 104, in response to which the package design tool 104 transmits package model information 206 to the proximity verifier 202. The package model information 206 contains information descriptive of the package model 201, such as the locations and sizes of signal vias and ground vias in the layers 104a–c of the package model 201. The proximity verifier 202 verifies the proximity of ground vias to signal vias in the package model 201 based on the package model information 206. The proximity verifier 202 generates proximity indicators 208, which indicate the results of the verification process. The proximity indicators 208 may, for example, indicate which signal vias, if any, in the package model 201 are not sufficiently close to ground vias.

The proximity verifier 202 may transmit the proximity indicators 208 to the package designer 116. The package designer 116 may inspect the proximity indicators 208, and may modify the package model 201 in response to the information contained in the proximity indicators 208. The package designer 116 may, for example, re-position any indicated signal vias in the package model 201 so that they are sufficiently close to ground vias. Alternatively, the package designer 116 may, for example, re-position ground vias in the package model 201 so that all signal vias in the package model 201 are sufficiently close to ground vias.

Figure 3A:
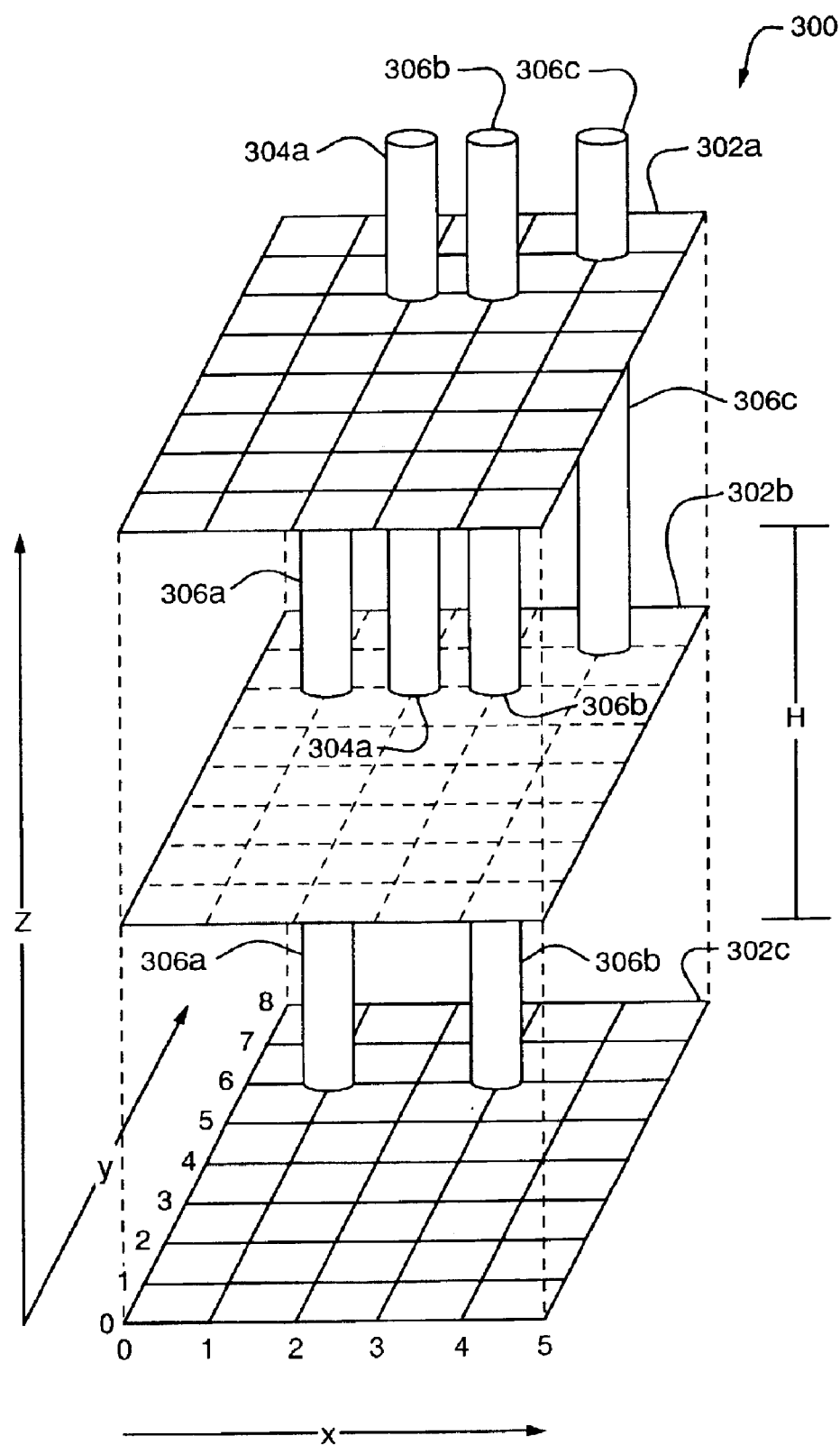
FIG. 3A is a perspective view of an integrated circuit package having three layers, including a signal layer between two ground layers, according to one embodiment of the present invention.

Operation of the system 200 according to various embodiments of the present invention will now be described in more detail. Throughout the description, various examples will be provided to illustrate the operation of embodiments of the present invention more clearly. Referring to FIG. 3A, for example, an example package 300 having three layers 302a–c is illustrated. The layers 302a–c may, for example, be the layers that are modeled by the layers 104a–c of the package model 201 (FIG. 2). Although package 300 has three layers 302a–c, in practice packages may have any number of layers. The package 300 may be one of multiple packages in an IC (not shown).

It should be appreciated that the layers 302a–c are not drawn to scale and that in general only relevant features of the layers 302a–c are shown for ease of illustration and explanation. The three dimensions of the package 300 are illustrated using x, y, and z axes. The values provided on the x and y axes in FIG. 3A do not correspond to particular units of measurement (such as millimeters or mils), but rather are generic units provided merely for ease of illustration and explanation. The x and y axes define what will be referred to herein as the "horizontal" dimensions of the package 300, while the z axis defines what will be referred to herein as the "vertical" dimension of the package 300.

The distance H between each layer of the package 300 will be referred to herein as a "vertical" distance. Signal nets traverse vertical path lengths through vias, which are vertical conductors or conductive paths forming the interconnection between one layer of an IC and another. The distance H is typically on the order of 100 $\mu$m. Distances measured within the x-y plane will be referred to herein as "horizontal" distances.

Layers 302a and 302c are ground layers. The surface of each of the layers 302a and 302c includes a grid of ground lines, as illustrated by solid lines in FIG. 3A. Ground layers 302a and 302c may alternatively be implemented as solid planes of ground metal, as is well-known to those of ordinary skill in the art. Furthermore, it is possible, although not common, for ground layers to include signal traces and for signal vias to terminate (i.e., start or end) on a ground plane.

Signal via 304a starts on signal layer 302b at coordinates (6, 2). The signal via 304a may be used to connect signal traces (not shown) in signal layer 302b to other signal layers (not shown) in the package 300. For example, as shown in FIG. 3A, signal via begins on signal layer 302b, extends upward through ground layer 302a, and continues to another signal layer (not shown).

Similarly, ground vias 306a–c may be used to connect ground lines in the ground layers 302a and 302c to each other and to other ground layers (not shown) in the package. For example, ground via 306a starts on ground layer 302c at coordinates (1, 6), extends upward through signal layer 302b, and ends on ground layer 302a. Ground via 306b starts on ground layer 302c at coordinates (3, 6), extends upward through signal layer 302b, and ends on ground layer 302a. Ground via 306c begins on signal layer 302b at coordinates (4, 7), extends upward through ground layer 302a, and ends on another ground layer (not shown). The number and locations of signal and ground vias in the package 300 are provided merely for purposes of example. The x-y grid is shown in dashed lines in signal layer 302b for ease of reference.

Figure 4A:
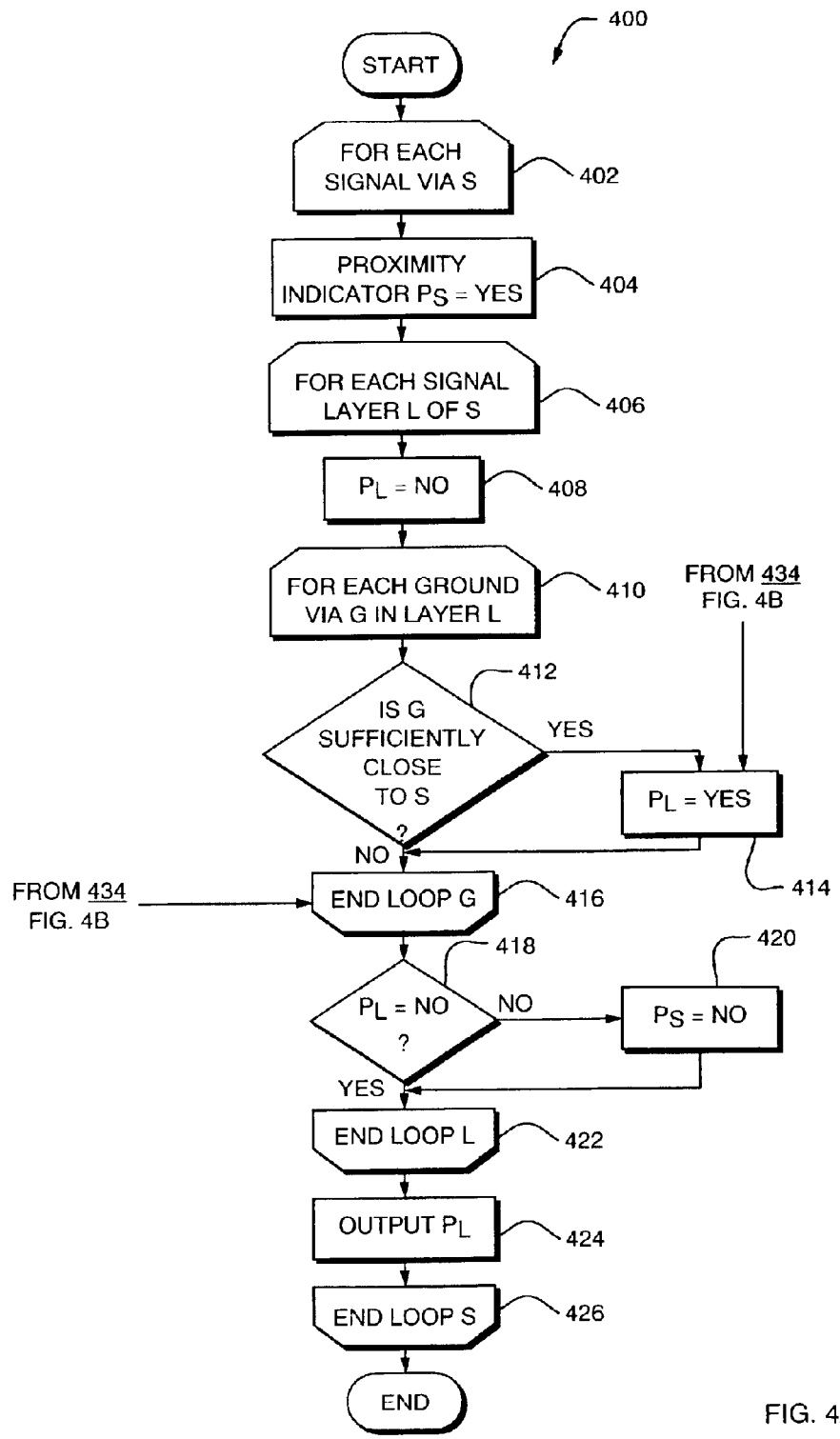
FIG. 4A is a flowchart of a method for verifying the proximity of ground vias to signal vias in an integrated circuit package according to one embodiment of the present invention.

Referring to FIG. 4A, a flowchart is shown of a proximity verification method 400 that is used by the proximity verifier 202 to verify the proximity of ground vias to signal vias in the package model 201 according to one embodiment of the present invention.

Prior to initiation of the method 400, the package designer 116 may provide configuration information 210 to the proximity verifier 202. The configuration information 210 may, for example, take the form of a command line with parameters, a configuration file stored on a hard disk drive, or commands issued to the proximity verifier 202 using a graphical user interface. Provision of the configuration information 210 to the proximity verifier 202 by the package designer 116 may therefore serve both to initiate the proximity verification method 400 and to provide parameter values to the proximity verifier 202 for use in the proximity verification method 400.

Figure 5:
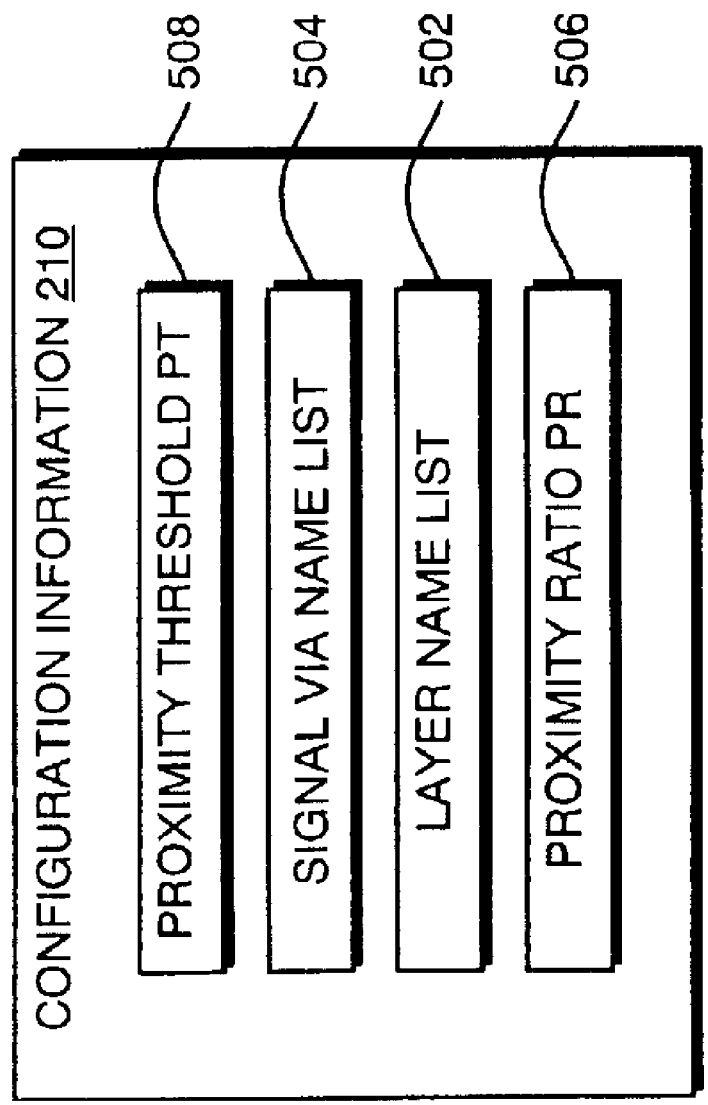
FIG. 5 is a block diagram of the logical structure of configuration information that is used to verify the proximity of ground vias to signal vias in an integrated circuit package according to one embodiment of the present invention.

Referring to FIG. 5, the logical structure of the configuration information 210 is illustrated according to one embodiment of the present invention. The configuration information 210 includes a proximity threshold 508. A signal via is considered to be sufficiently close to a ground via if the distance between the signal via and the ground via is not greater than the proximity threshold PT 508. The proximity threshold 508 may, for example, specify a horizontal distance, i.e., a distance between signal via (x, y) coordinates and ground via (x, y) coordinates. The proximity threshold 508 may be any value, and may be specified in any units, such as millimeters, mils, or microns. The configuration information 210 also includes a signal via name list 504, which is a list of the names of the signal vias to be processed by the proximity verification method 400.

The configuration information 210 also includes a layer name list 502, which is a list of the names of package layers to be processed by the proximity verification method 400. The signal via name list 504 and the layer name list 502 may specify the names of signal vias and layers, respectively, using the same names used within the package model 201 itself.

Referring again to FIG. 4A, the proximity verification method 400 enters a loop over each signal via S specified by the signal via name list 504 (step 402). The method 400 initializes a proximity indicator $P_S$ for signal via S to a value of YES (step 404). A proximity indicator value of YES indicates that the corresponding signal via is sufficiently proximate to one or more ground vias, and a proximity indicator value of NO indicates that the corresponding signal via is not sufficiently proximate to a ground via.

The method 400 enters a loop over each layer L of signal via S (step 406). As used herein, the term "layer of signal via S" refers to any layer through which signal via S passes or on which signal via S terminates (i.e., starts or ends). For example, the layers of signal via 304a include layers 302b (on which signal via 304a begins) and 302a (through which signal via 304a passes). The method 400 may also limit the loop initiated in step 406 to those layers specified by the layer name list 502 (FIG. 5).

The method 400 initializes a layer-specific proximity indicator $P_L$ with a value of NO (step 408). The proximity indicator $P_L$ indicates whether there is a ground via sufficiently close to signal via S within layer L.

The method 400 enters a loop over each ground via G in layer L (step 410). A signal via or ground via is "in" a layer if the via passes through or terminates on a layer. For example, ground via 306a is "in" layer 302a because it terminates on layer 302a, while ground vias 306b–c are "in" layer 302a because they pass through layer 302a.

The method 400 determines whether ground via G is sufficiently close to signal via S in layer L (step 412). If ground via G is sufficiently close to signal via S in layer L, the method 400 assigns a value of YES to the proximity indicator $P_L$ (step 414). The method 400 repeats steps 412–414 for the remaining ground vias in layer L (step 416). Thus, $P_L$ is assigned a value of YES only if there is a ground via in layer L that is sufficiently close to signal via S.

If the value of $P_L$ is NO (step 418), then the proximity indicator $P_S$ is assigned a value of NO (step 420). Steps 408–420 are repeated for the remaining layers of signal via S (step 422). The proximity indicator $P_S$ is therefore assigned a value of YES only if at least one ground via is sufficiently close to signal via S in each of signal via S's layers. In other words, the method 400 determines that ground vias are sufficiently close to signal via S if at least one ground via is sufficiently close to signal via S in each of signal via S's layers.

The method 400 outputs the value of $P_S$ by, e.g., appending the value of $P_S$ to the proximity indicators 208 (step 424). The method 400 verifies the proximity of ground vias to the remaining signal vias specified by the signal via name list 504 (step 426).

Upon completion of the method 400, the proximity indicators 208 indicate the proximity status of all of the signal vias specified by the signal via name list 504 in each of the layers specified by the layer name list 502. Alternatively, the proximity indicators 208 may indicate the proximity status of only those signal vias which are not sufficiently close to ground vias (i.e., for which the value of $P_S$ is NO upon the conclusion of method 400), in which case the proximity indicators 208 may be considered to be error indicators. The proximity indicators 208 may, for example, be stored in a text file or be represented as design rule violation indicators 214 in the package model 201, as described in more detail below. The package designer 116 may examine the proximity indicators 208 to determine whether any signal vias and/or ground vias should be re-located so that all signal vias are sufficiently close to ground vias.

Figure 4B:
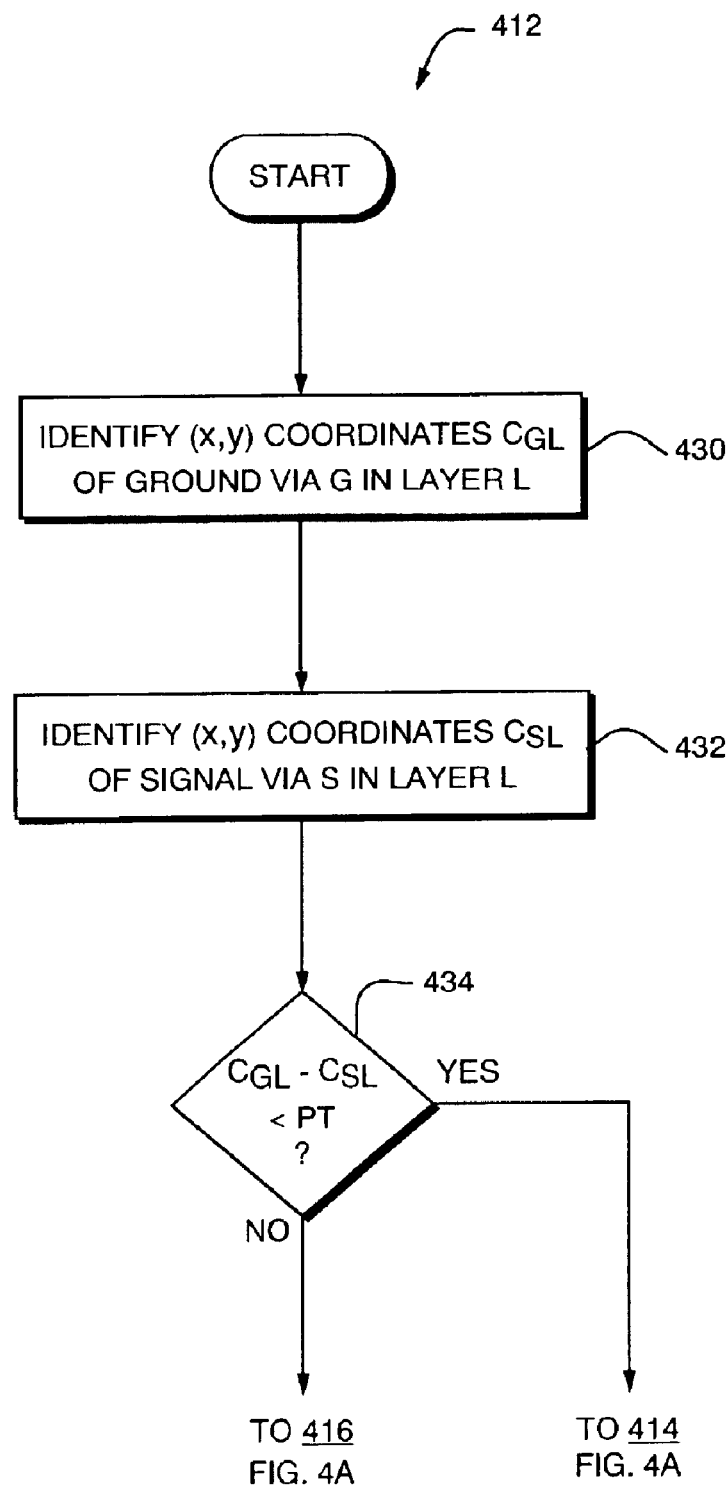
FIG. 4B is a flowchart of a method for determining whether there is a ground via sufficiently close to a signal via in an integrated circuit package layer according to one embodiment of the present invention.

Having described generally the operation of the proximity verifier 202, various embodiments of the method 400 illustrated in FIG. 4A will now be described in more detail. Referring to FIG. 4B, a flowchart of a method is illustrated for determining whether ground via G is sufficiently close to signal via S in layer L (FIG. 4A, step 412) according to one embodiment of the present invention.

The method 412 identifies (x, y) coordinates $C_{GL}$ of ground via G in layer L (step 430). The method 412 identifies (x, y) coordinates $C_{SL}$ of signal via S in layer L (step 432). As described in more detail below, each of these (x, y) coordinates may be one or more pairs of (x, y) coordinates.

The method 412 determines whether the distance between coordinates $C_{GL}$ and $C_{SL}$ is less than the proximity threshold PT 508 (step 434). In other words, the method 412 determines whether coordinates $C_{GL}$ of ground via G within layer L fall within a circle centered at the coordinates $C_{SL}$ of signal via S and having a radius equal to the proximity threshold PT 508. If the ground via coordinates $C_{GL}$ do not fall within such a circle, control passes to step 416 of FIG. 4A. If the ground via coordinates $C_{GL}$ do fall within such a circle, ground via G is sufficiently close to signal via S in layer L, and control passes to step 414 (FIG. 4A), where the proximity indicator $P_L$ is assigned a value of YES.

Figure 3B:
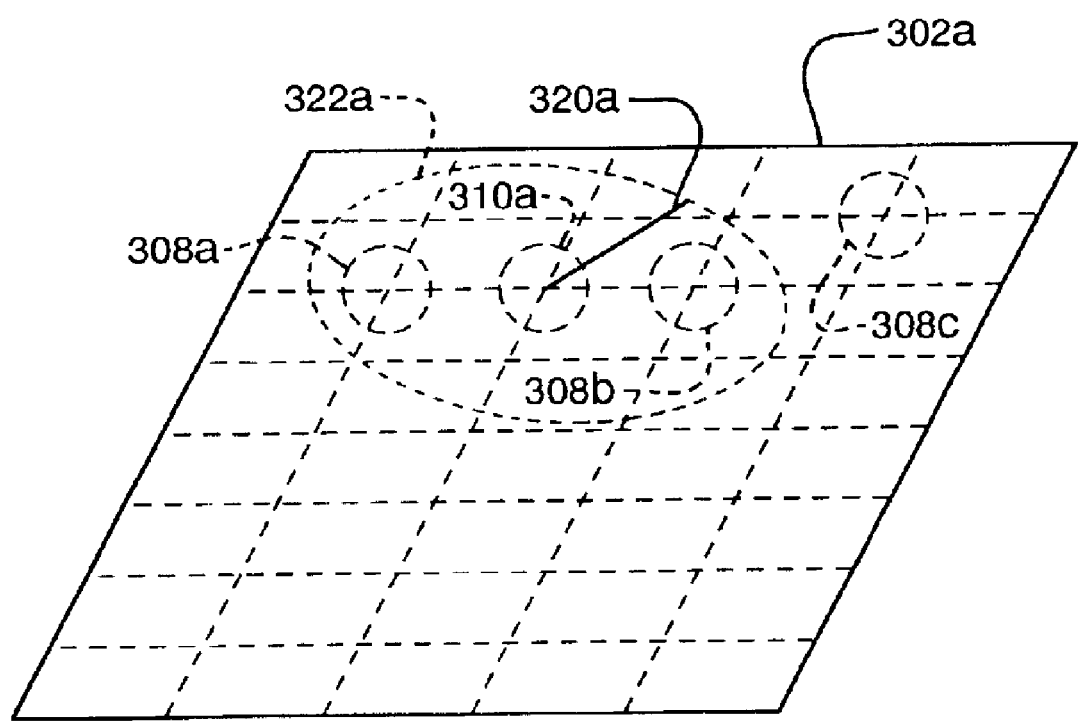
FIG. 3B is a magnified perspective view of the signal layer of the integrated circuit package illustrated in FIG. 3A according to one embodiment of the present invention.

For example, referring to FIG. 3B, ground layer 302a is magnified to more clearly illustrate the relative locations of signal via 304a and ground vias 306a–c. Cross-sections 308a–c of ground vias 306a–c lie within the plane of layer 302a and represent the areas within which ground vias 306a–c intersect layer 302a. Similarly, cross-section 310a represents the area within which signal via 304a intersects layer 302a. Note that a via "intersects" a layer if the via either passes through the layer (as in the case of ground vias 304a and 304c and signal via 304a in layer 302a) or if the via terminates on a layer (as in the case of ground via 306*a* in layer 302*a*).

Circle 322*a* is centered at the center of signal via cross-section 310*a*, namely (x, y) coordinates (2, 6). The method 412 may, for example, identify the (x, y) coordinates of signal via S in step 432 as the coordinates of the center of the signal via in layer L. Circle 322*a* has a radius 320*a* equal in length to the proximity threshold PT 508.

The method 412 may, for example, identify the (x, y) coordinates of ground via G as the coordinates of the center of ground via G in layer L. For example, referring again to FIG. 3B, the method 412 may identify the center of ground via cross-section 308*a* as the coordinates of ground via 306*a*, namely coordinates (1, 6).

In this example, performing step 434 (FIG. 4B) for signal via 304*a* in layer 302*a* (represented by signal via cross-section 310*a* in FIG. 3B) is equivalent to determining whether the centers of any ground via cross-sections 308*a*–*c* in layer 302*a* fall within the circle 322*a*. As may be seen from FIG. 3B, ground via cross-sections 308*a* and 308*b* fall within circle 322*a*. As a result, step 434 of FIG. 4B would conclude that there is at least one ground via in layer 302*a* within radius PT of the coordinates of signal via 304*a*. Note that decreasing the radius PT might change the outcome of step 434.

Figure 3C:
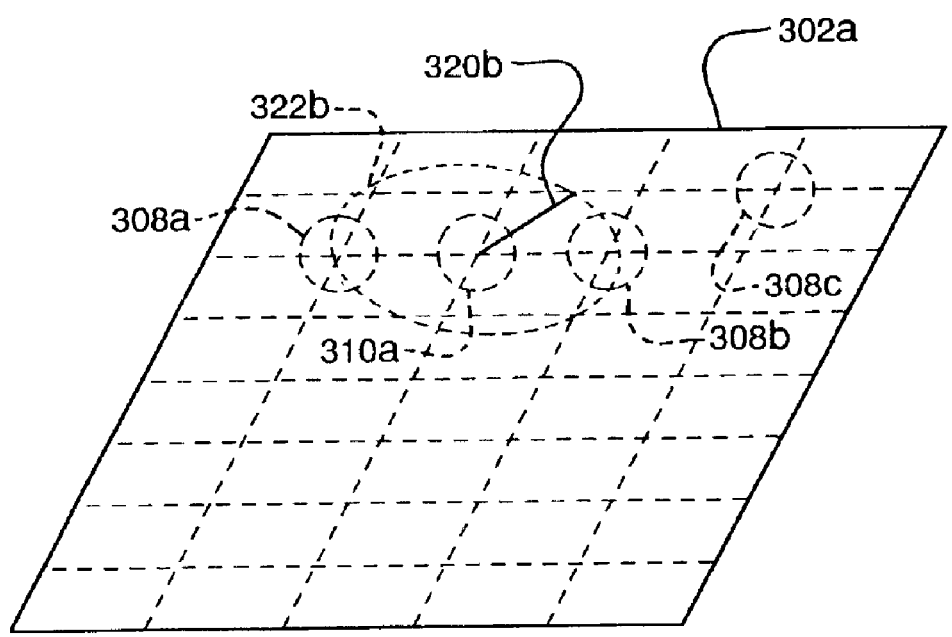
FIG. 3C is a magnified perspective view of the signal layer of the integrated circuit package illustrated in FIG. 3A according to another embodiment of the present invention.
Figure 3D:
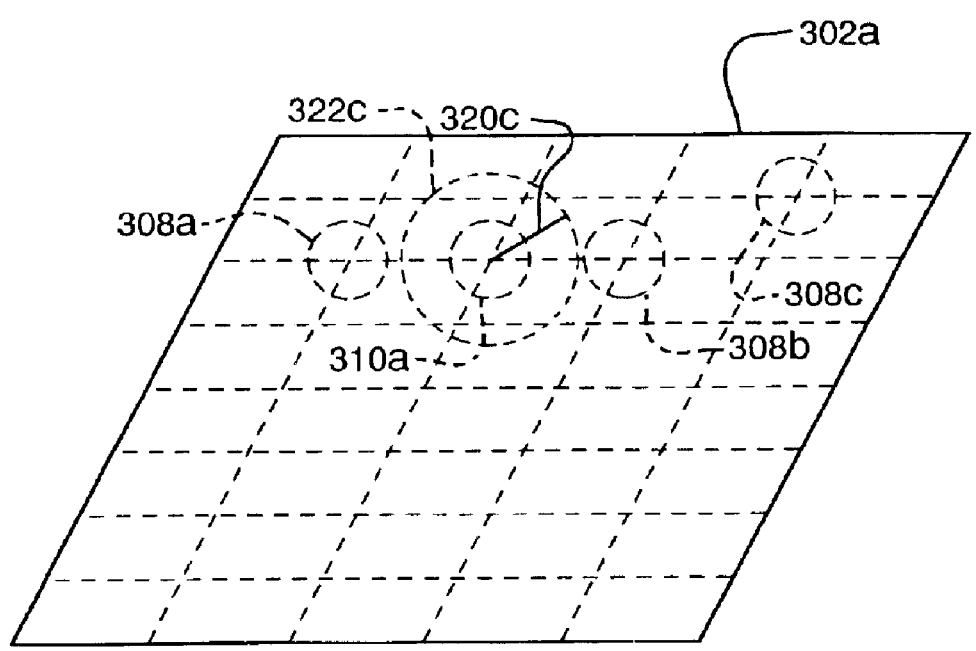
FIG. 3D is a magnified perspective view of the signal layer of the integrated circuit package illustrated in FIG. 3A according to yet another embodiment of the present invention.

For example, referring to FIG. 3D, an example of ground layer 302*a* is shown in which the proximity threshold PT (represented by radius 320*c*) is smaller than in FIG. 3B. In such an embodiment, signal via 304*a* (corresponding to cross-section 310*a*) would be determined in step 412 not to be sufficiently close to ground vias 306*a*–*c* (corresponding to cross-sections 308*a*–*c*, respectively), because none of cross-sections 308*a*–*c* falls within circle 322*c*.

If either or both of the coordinates $C_{GL}$ or $C_{SL}$ include multiple pairs of coordinates, step 434 may be-repeated for each combination of coordinates $C_{GL}$ and $C_{SL}$. The result of step 434 may be determined to be YES if the results of each iteration of step 434 is YES, thereby requiring that all combinations of $C_{GL}$ or $C_{SL}$ be within distance PT of each other.

The proximity verification method 400 described above with respect to FIGS. 4A–4B determines that a signal via is sufficiently close to ground vias if at least one ground via is sufficiently close to the signal via in each of the signal via's layers. More generally, the proximity verifier 202 may require that at least a minimum number of ground vias be sufficiently close to a signal via in each of the signal via's layers. For example, referring again to FIG. 5, the configuration information 210 may include a proximity ratio PR 506. The proximity ratio 506 indicates the minimum number of ground vias that must be within the proximity threshold PT 508 of each layer of each signal via.

Figure 4C:
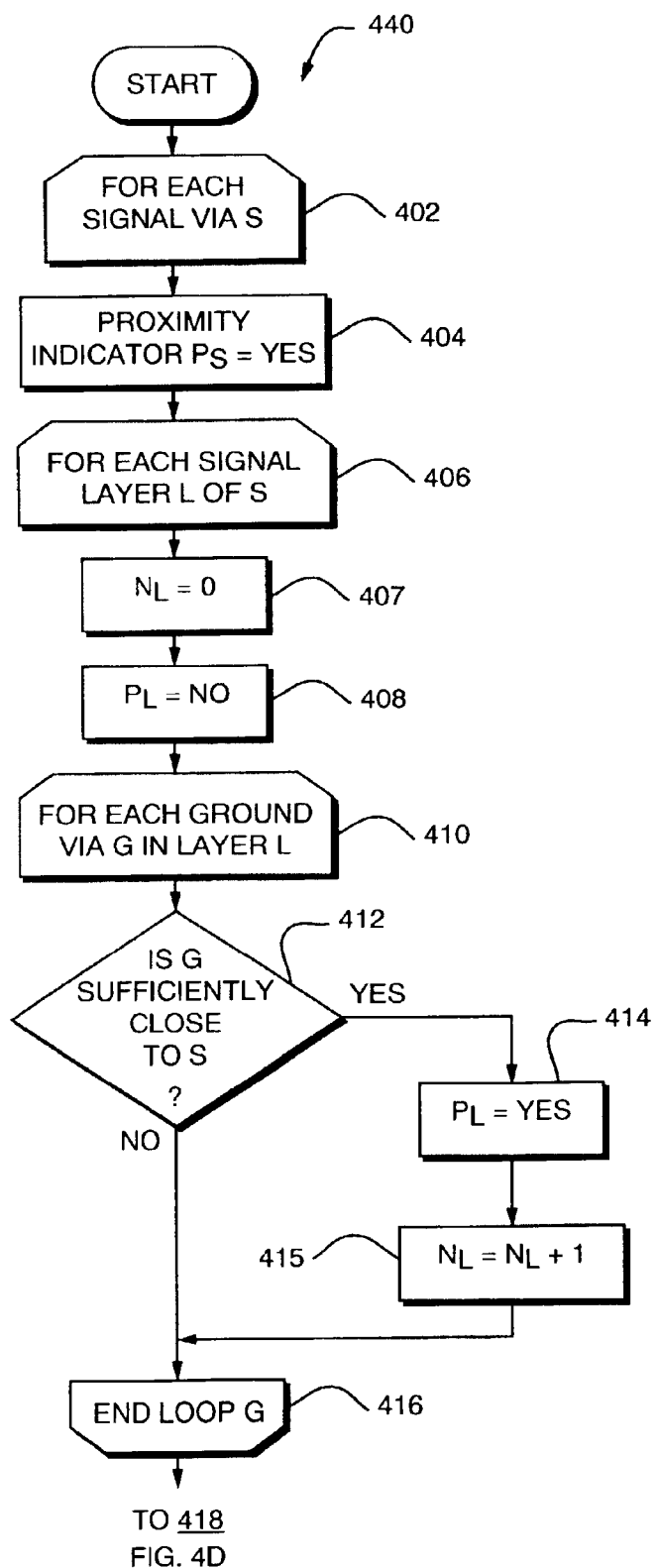
FIGS. 4C–4D are flowcharts of a method for determining whether there is a ground via sufficiently close to a signal via in an integrated circuit package layer according to another embodiment of the present invention.
Figure 4D:
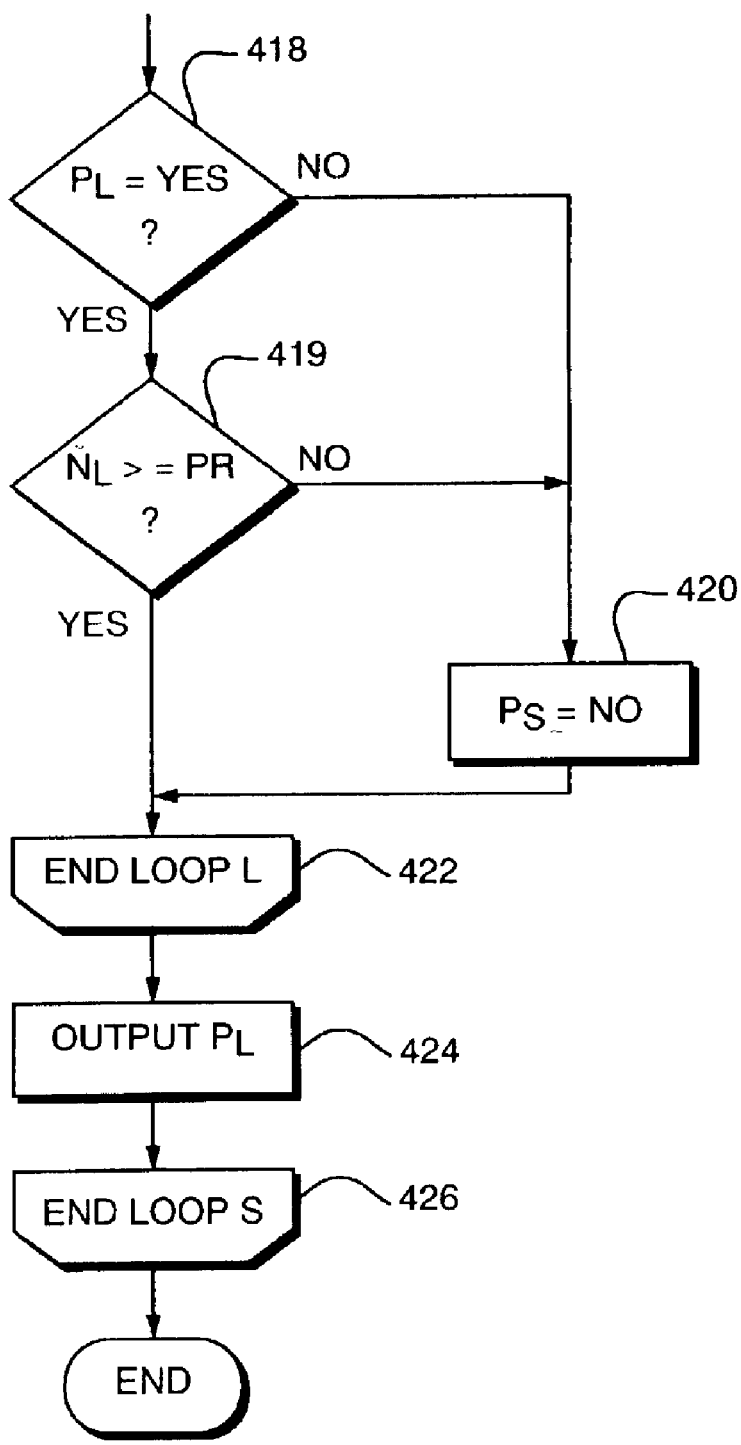

To apply the proximity ratio PR, the method 400 may, for example, be modified to maintain a counter $N_L$ of the number of ground vias that have been identified within the proximity threshold of signal via S of the current layer L. For example, referring to FIGS. 4C–4D, a flowchart of an alternative proximity verification method 440 is shown according to one embodiment of the present invention. The method 440 includes the same steps as method 400 (FIG. 4A), except for the following. The counter $N_L$ is initialized to zero (step 407). Each time a ground via G is identified that is sufficiently close to signal via S within layer L (i.e., each time the result of step 412 is YES), the counter $N_L$ is incremented (step 415). To enforce the minimum proximity ratio PR 506, the proximity indicator $P_L$ is only assigned a value of YES if the value of $N_L$ is greater than or equal to the proximity ratio PR 506 (step 419). At the conclusion of step 422, the proximity indicator $P_L$ will have a value of YES only if there are at least PR ground vias within distance PT of signal via S in each layer of signal via S.

The proximity verifier 202 may require that each signal via be sufficiently close to a distinct ground via. In other words, the proximity verifier 202 may not allow the same ground via to count as sufficiently close to more than one signal via. The proximity verifier 202 may enforce this requirement by, for example, creating a list of all ground vias (e.g., at the beginning of method 400), and by removing a ground via G from the list of ground vias if the ground via G is determined to be sufficiently close to signal via S in step 412 (FIG. 4A). As a result, the method 400 will count each ground via as sufficiently close to at most one signal via.

The proximity verifier 202 may require that ground vias be both sufficiently close to and arranged in a particular pattern around each signal via in the package model 201. For example, the proximity verifier 202 may require that there be ground vias on opposite sides of each signal via. For example, referring again to FIG. 3B, ground vias 306*a* and 306*b* (represented by cross-sections 308*a* and 308*b*, respectively) are on opposite sides of signal via 304*a* (represented by cross-section 310*a*) within layer 302*a*. Alternatively, the proximity verifier 202 may require that ground vias be arranged in a rectangular or circular pattern around each signal via. Those of ordinary skill in the art will appreciate how to modify the proximity verification method 400 to require that ground vias be arranged in a particular pattern around each signal via.

The methods described above with respect to FIGS. 4A–4B make use of various data from the package model 201, such as the names and coordinates of signal vias and ground vias. Various techniques that may be used by the proximity verifier 202 to access and process such data will now be described in more detail.

As described above with respect to FIG. 2, the proximity verifier 202 may access information in the package model 201 by transmitting package model access commands 204 to the package design tool 104. The package model access commands 204 may take any of a variety of forms. For example, the package design tool 104 may provide an application program interface (API) through which external software programs may access information contained in the package model 201 using commands defined according to the API. The proximity verifier 202 may be implemented as such a software program, and the package model access commands 204 may be implemented as commands defined according to the package design tool's API. The API may include both commands for reading information from the package model 201 and commands for writing information to the package model 201. In such an implementation, the proximity verifier 202 transmits package model access commands 204 to the package design tool 104, in response to which the package design tool 104 either modifies information in the package model 201 or transmits the requested information about the package model 201 to the proximity verifier 202 in the form of package model information 206.

The package model information 206 may, for example, be a report, such as one of the conventional package property reports 110 described above with respect to FIG. 1. Such a report may be a text file including information such as the names, locations, and sizes (e.g., lengths and/or diameters) of signal traces, ground metal, signal and ground vias, and other elements of the package model 201. The proximity verifier 202 may process the information in such a report to perform the functions described herein using techniques that are well-known to those of ordinary skill in the art.

The proximity verifier 202 may be implemented as a software program that executes within the design environment provided by the package design tool 104. For example, the APD package design tool described above provides a scripting language named "Skill." Scripts written in the Skill language may be executed within the APD design environment, e.g., while the package designer 116 is using the package design tool 104 to design the package model 201. The proximity verifier 202 may be implemented as a Skill script, in which case the package model access commands 204 may be Skill commands issued by the proximity verifier 202 to the package design tool 104. Alternatively, the proximity verifier 202 may, for example, be implemented as a Perl script for use with other package design tools.

Referring again to FIG. 2, the package model 201 may include design rules 212 which specify constraints that elements within the package model 201 must satisfy to ensure successful fabrication and operation of the package being modeled. Such constraints may include, for example, electrical, geometrical, or timing constraints. A design rule may, for example, specify a minimum distance between signal traces in a layer, or specify a maximum signal trace density in a layer. Conventional package design tools, such as APD, typically provide default design rules and means for specifying additional design rules to be applied to a package model. Conventional package design tools also typically include automated Design Rule Checkers (DRCs), which automatically determine whether the active design rules are satisfied, and which use design rule violation indicators 214 to alert the package designer 116 to any design rules which are violated by the package model 201. The design rule violation indicators 214 may, for example, be visual indicators (such as a red flag) displayed at the location of the violation within the graphical package representation 106 that is displayed to the package designer 116.

Rather than providing the package designer 116 with external proximity indicators 208 to indicate whether ground vias are sufficiently close to signal vias in the package model 201, the proximity verifier 202 may use package model access commands 204 to insert design rule violation indicators 214 into the package model 201 when the proximity verifier 202 determines that a ground via is not sufficiently close to a signal via. For example, referring again to FIG. 4A, step 424 (outputting the proximity indicator P$_s$) may be implemented by adding a design rule violation indicator to the package model 201 if the value of P$_S$ is NO. The design rule violation indicator thus provided may indicate the signal via for which the design rule violation was identified. Techniques for adding design rule violation indicators to package models maintained by conventional package design tools are well-known to those of ordinary skill in the art.

In one embodiment, the requirement that there be a ground via sufficiently close to signal vias in the package model 201 is implemented using a design rule (referred to herein as the "proximity rule") within the design rules 212. In such an embodiment, it may not be necessary for the proximity verifier 202 to be implemented as a distinct external component, since the package design tool 104 may automatically apply the proximity rule. Furthermore, in such an embodiment, the proximity rule may be designed to verify that there is a ground via sufficiently close to the signal via currently being edited by the package designer 116, rather than to verify the proximity of a ground via to a plurality of signal vias, as illustrated and described above with respect to FIGS. 4A and 4B.

Some package design tools, such as APD, provide "real-time" design rule checking, according to which the design rule violation indicators 214 are provided (e.g., displayed) to the package designer 116 as the package designer 116 designs the package model 201. For example, the package designer 116 may place a new signal trace within a layer of the package model 201 by using a mouse to drag a graphical representation of the signal trace to an appropriate location within the layer. The package design tool 104 may visually indicate to the package designer 116 in real-time whether the new signal trace is too close to existing signal traces, such as by displaying a red flag on the monitor 112 when the designer 116 drags the new signal trace too close to an existing signal trace.

The proximity rule may, for example, be implemented as a real-time design rule. In such an implementation, the package design tool 104 may verify in real-time that the proximity rule is satisfied for the signal via being edited by the package designer 116, and provide appropriate design rule violation indicators 214 when the proximity rule is violated.

As described above with respect to FIG. 4B, the proximity verifier 202 may identify (x, y) coordinates of both ground via G (step 430) and signal via S (step 432). Examples of various ways in which the proximity verifier 202 may identify such coordinates will now be described in more detail.

As described above with respect to FIG. 3B, the coordinates of the ground via G may be identified as the coordinates of the center of ground via G, and the coordinates of the signal via S may be identified as the coordinates of the center of signal via S. Other coordinates, however, may be used as the coordinates of G and S. For example, the coordinates of G and S may be identified as the coordinates of one or more points on the outer edges of the cross-sections of G and S within layer L.

For example, in one embodiment, all coordinates within the cross-section of ground via G in layer L are chosen as ground via G's coordinates in step 430, and the coordinates of the center of signal via S's cross-section in layer L are chosen as signal via S's coordinates in step 432. Referring again to FIG. 3B, for example, in this embodiment the step of determining whether the distance between ground via G and signal via S is less than or equal to the proximity threshold PT is equivalent to determining whether all of the cross-section of ground via G in layer L falls within a circle centered on the center of signal via S's cross-section and having radius PT. For example, consider signal via cross-section 310a and ground via cross-section 308a. As may be seen from FIG. 3B, all of ground via projection 308a falls within circle 322a, so in the present embodiment the ground via 306a (corresponding to cross-section 308a) would be determined to be sufficiently close to signal via 304a (corresponding to cross-section 310a) in step 434.

In another embodiment, the coordinates of ground via G are identified as the coordinates in ground via G's cross-section which are most distant from the center of signal via S. In yet another embodiment, the coordinates of ground via G are identified as the coordinates in ground via G's cross-section which are closest to the center of signal via S. In such an embodiment, step 434 is equivalent to determining whether any portion of the cross-section of ground via G is within distance PT of signal via S's coordinates.

For example, referring to FIG. 3C, an example of ground layer 302a is shown in which the proximity threshold PT (represented by radius 320b) is smaller than in FIG. 3B. In such an embodiment, signal via 304*a* (corresponding to cross-section 310*a*) would be determined in step 412 to be sufficiently close to ground vias 306*a* and 306*b* (corresponding to cross-sections 308*a* and 308*b*, respectively), because some of cross-sections 308*a* and 308*b* fall within circle 322*b*. Alternatively, the proximity verifier 202 may, for example, require that a particular minimum percentage of a ground via cross-section fall within radius PT of signal via S.

The proximity verifier 202 need not identify the center of signal via S's cross-section as its coordinates in step 432. Alternatively, for example, the proximity verifier 202 may identify the coordinates of some or all of the outer edge of signal via S's cross-section as signal via S's coordinates in step 432.

The various techniques for selecting coordinates of the ground via G and the signal via S may be combined in any way. Furthermore, the present invention is not limited to use with the particular coordinate selection techniques disclosed herein.

Among the advantages of the invention are one or more of the following.

One advantage of various embodiments of the present invention is that they automate verification of the proximity of ground vias to signal vias in an integrated circuit design, a process which conventionally is performed manually. Automated proximity verification enables such verification to be performed more quickly and reliably than manual verification.

Furthermore, the proximity indicators 208 provided by the proximity verifier 202 may be visual indicators included in the graphical representation 106 of the package model 201. Such visual indicators may point out the precise location of problematic signal vias to the package designer 116, thereby making it easier for the package designer 116 to locate and re-position such signal vias. In particular, in embodiments in which the function performed by the proximity verifier 202 is implemented in a real-time design rule, visual indications of problematic signal vias may be provided to the package designer 116 as the package designer 116 is designing signal vias, thereby potentially preventing problematic signal via placements from occurring. A system which employs real-time proximity verification may enable package design to occur more rapidly and accurately than a system in which proximity verification is only performed after the package design is created.

A further advantage of various embodiments of the present invention is that they provide cross-layer design rule checking. Although existing package design tools include built-in design rules, such rules typically define constraints, such as minimum inter-signal distance, that must be satisfied within a single package layer. Such design rules do not, however, address constraints, such as proximity of signal vias to ground vias, that span multiple package layers. Similarly, automated crosstalk analysis tools typically analyze crosstalk within a single package layer. Various embodiments of the present invention provide means for verifying that cross-layer constraints, such as proximity of signal vias to ground vias, are satisfied, thereby relieving the package designer 116 of the responsibility for performing such verification manually.

A further advantage of various embodiments of the present invention is that they facilitate the transmission of signals along signal lines having a constant characteristic impedance. Lack of ground vias in sufficient proximity to signal vias causes changes in impedance along the signal via. Such changes in impedance cause degradation of the transmitted signal. As the rise time of the signal driver decreases, smaller discontinuities will have a larger impact on signal integrity. The aggregate impact of such discontinuities can be to degrade the integrity of the signal so much that may not be reliably received at the receiver. It is therefore desirable to decrease the number and size of such discontinuities, particularly in high-frequency environments. By enabling the package designer 116 to identify and eliminate such discontinuities, various embodiments of the present invention facilitate the process of designing circuits with high signal integrity.

It is to be understood that although the invention has been described above in terms of particular embodiments, the foregoing embodiments are provided as illustrative only, and do not limit or define the scope of the invention. Various other embodiments, including but not limited to the following, are also within the scope of the claims.

One advantage of the techniques disclosed herein is that they may be used to reduce the amount of coupling between signals in an integrated circuit design. It is undesirable, for example, for a large number of signals to share a single ground return because of the cross-coupling noise that such an arrangement introduces in the signals. The techniques disclosed herein may be used to enforce the requirement that each signal via be sufficiently close to a distinct ground via or that there be a particular minimum ratio of ground vias to signal vias. Such techniques may be used to reduce cross-coupling noise.

Although the techniques described above are described with respect to ground planes, it should be appreciated that similar techniques may be applied in integrated circuits employing signal-reference power supplies to verify that signal vias are sufficiently close to power.

Although the drawings illustrate various data structures (e.g., the configuration information in FIG. 5) as having particular logical structures, these are provided merely for purposes of example and do not constitute limitations of the present invention. Rather, alternative data structures for representing equivalent information and for performing equivalent functions will be apparent to those of ordinary skill in the art. Furthermore, although various data structures are described as being implementable as text files, this is not a limitation of the present invention. Rather, such data structures may be implemented as binary files, database files, or using any appropriate computer-readable format.

Furthermore, although the proximity verifier 202 and the configuration information 210 are illustrated in FIG. 2 as distinct entities, it should be appreciated that they may be combined or further subdivided. For example, the proximity verifier 202 may be hard-coded with information contained in the configuration information 210.

Elements and components described herein may be further divided into additional components or joined together to form fewer components for performing the same functions.

The techniques described above may be implemented, for example, in hardware, software, firmware, or any combination thereof. The proximity verifier 202 may, for example, be implemented as a computer program. The techniques described above may be implemented in one or more computer programs executing on a programmable computer including a processor, a storage medium readable by the processor (including, for example, volatile and non-volatile memory and/or storage elements), at least one input device, and at least one output device. Program code may be applied to input entered using the input device to perform the functions described and to generate output. The output may be provided to one or more output devices.

Each computer program within the scope of the claims below may be implemented in any programming language, such as assembly language, machine language, a high-level procedural programming language, or an object-oriented programming language. The programming language may, for example, be a compiled or interpreted programming language.

Each such computer program may be implemented in a computer program product tangibly embodied in a machine-readable storage device for execution by a computer processor. Method steps of the invention may be performed by a computer processor executing a program tangibly embodied on a computer-readable medium to perform functions of the invention by operating on input and generating output. Suitable processors include, by way of example, both general and special purpose microprocessors. Generally, the processor receives instructions and data from a read-only memory and/or a random access memory. Storage devices suitable for tangibly embodying computer program instructions include, for example, all forms of non-volatile memory, such as semiconductor memory devices, including EPROM, EEPROM, and flash memory devices; magnetic disks such as internal hard disks and removable disks; magneto-optical disks; and CD-ROMs. Any of the foregoing may be supplemented by, or incorporated in, specially-designed ASICs (application-specific integrated circuits). A computer can generally also receive programs and data from a storage medium such as an internal disk (not shown) or a removable disk. These elements will also be found in a conventional desktop or workstation computer as well as other computers suitable for executing computer programs implementing the methods described herein, which may be used in conjunction with any digital print engine or marking engine, display monitor, or other raster output device capable of producing color or gray scale pixels on paper, film, display screen, or other output medium.

What is claimed is:

1. A computer-implemented method comprising steps of:
   (A) identifying a signal via in an integrated, circuit design; and
   (B) determining whether there is at least one signal return path in the integrated circuit design within a predetermined threshold distance from the signal via.

2. The method of claim 1, wherein the step (A) comprises a step of identifying coordinates of the signal via, and wherein the step (B) comprises steps of:
   (B) (1) identifying coordinates of a first signal return path in the integrated circuit design; and
   (B) (2) determining whether the signal via coordinates differ from the first signal return path coordinates by more than the predetermined threshold distance.

3. The method of claim 2, wherein the step (B) (1) comprises a step of identifying a plurality of coordinates of the first signal return path, and wherein the step (B) (2) comprises steps of:
   (B) (2) (a) determining whether the signal via coordinates differ from any of the plurality of signal return path coordinates by more than the predetermined threshold distance;
   (B) (2) (b) determining that there is no signal return path within the predetermined threshold distance of the signal via if it is determined in step (B) (2) (a) that the signal via coordinates differ from any of the signal return path coordinates by more than the predetermined threshold distance; and
   (B) (2) (c) determining that there is a signal return path within the predetermined threshold distance of the signal via if it is determined in step (B) (2) (a) that the segment coordinates differ from none of the signal return path coordinates by more than the predetermined threshold distance.

4. The method of claim 2, wherein the signal via coordinates comprise two-dimensional coordinates within a first layer of the integrated circuit design, wherein the first signal return path coordinates comprise two-dimensional coordinates within the first layer of the integrated circuit design, and wherein the step (B) (2) comprises steps of:
   (B) (2) (a) identifying the length of a line having as endpoints the signal via coordinates and the first signal return path coordinates;
   (B) (2) (b) determining that the signal via coordinates differ from the first signal return path coordinates by more than the predetermined threshold distance if the length of the identified line is greater than the predetermined threshold distance; and
   (B) (2) (c) determining that the signal coordinates do not differ from the first signal return path coordinates by more than the predetermined threshold distance if the length of the identified line is not greater than the predetermined threshold distance.

5. The method of claim 2, wherein the signal via coordinates comprise coordinates of the center of a cross-section of the signal via within a first layer of the integrated circuit design.

6. The method of claim 2, wherein the signal via coordinates comprise coordinates of an edge of a cross-section of the signal via within a first layer of the integrated circuit design.

7. The method of claim 3, wherein the first signal return path comprises all signal return paths in the integrated circuit design.

8. The method of claim 1, wherein the signal via comprises one of a plurality of signal vias in the integrated circuit design, and wherein the method further comprises a step of:
   (C) performing the steps (A) and (B) for each of the plurality of signal vias.

9. The method of claim 1, wherein the integrated circuit design comprises a computer-implemented model of an integrated circuit tangibly stored in a computer-readable medium.

10. The method of claim 1, further comprising a step of:
    (C) providing an error indication if it is determined in the step (B) that there is no signal return path in the integrated circuit design within the predetermined threshold distance from the signal via.

11. The method of claim 10, wherein the indication comprises a visual indication in a graphical representation of the integrated circuit design.

12. The method of claim 1, wherein the signal return path comprises ground metal.

13. The method of claim 1, wherein the signal return path comprises power.

14. The method of claim 1, wherein the step (A) comprises a step of identifying a plurality of layers in the integrated circuit design containing the signal via, and wherein the step (B) comprises a step of determining whether there is at least one signal return path in each of the plurality of layers within the predetermined threshold distance from the signal via.

15. A system comprising:
a computer-readable medium tangibly embodying an integrated circuit design; and
signal via identification means for identifying a signal via in the integrated circuit design; and
first proximity verification means for determining whether there is a signal return path in the integrated circuit design within a predetermined threshold distance from the signal via.

16. The system of claim 15, wherein the signal via identification means comprises means for identifying coordinates of the signal via, and wherein the first proximity verification means comprises:
first signal return path coordinate identification means for identifying coordinates of a first signal return path in the integrated circuit design; and
first coordinate comparison means for determining whether the signal via coordinates differ from the first signal return path coordinates by more than the predetermined threshold distance.

17. The system of claim 16, wherein the first signal return path coordinate identification means comprises means for identifying a plurality of coordinates of the first signal return path in the integrated circuit design, and wherein the first coordinate comparison means comprises:
means for determining whether the signal via coordinates differ from any of the plurality of signal return path coordinates by more than the predetermined threshold distance;
means for determining that there is no signal return path within the predetermined threshold distance of the signal via if it is determined that the signal via coordinates differ from any of the signal return path coordinates by more than the predetermined threshold distance; and
means for determining that there is a signal return path within the predetermined threshold distance of the signal trace segment if it is determined that the signal via coordinates differ from none of the signal return path coordinates by more than the predetermined threshold distance.

18. The system of claim 16, wherein the signal via coordinates comprise two-dimensional coordinates within the first layer of the integrated circuit design, wherein the first signal return path coordinates comprise two-dimensional coordinates within the second layer of the integrated circuit design, and wherein the first coordinate comparison means comprises:
means for identifying the length of a line having as endpoints the signal via coordinates and the first signal return path coordinates;
means for determining that the signal via coordinates differ from the first signal return path coordinates by more than the predetermined threshold distance if the length of the identified line is greater than the predetermined threshold distance; and
means for determining that the signal via coordinates do not differ from the first signal return path coordinates by more than the predetermined threshold distance if the length of the identified line is not greater than the predetermined threshold distance.

19. The system of claim 16, wherein the signal via coordinates comprise coordinates of the center of a cross-section of the signal via within a first layer of the integrated circuit design.

20. The system of claim 16, wherein the signal via coordinates comprise coordinates of an edge of a cross-section of the signal via within a first layer of the integrated circuit design.

21. The system of claim 17, wherein the first signal return path comprises all signal return paths in the integrated circuit design.

22. The system of claim 15, wherein the signal via comprises one of a plurality of signal vias in the integrated circuit design, and wherein the system further comprises:
segment iteration means for applying the signal via identification means and the first proximity verification means to each of the plurality of signal vias.

23. The system of claim 15, wherein the integrated circuit design comprises a computer-implemented model of an integrated circuit tangibly stored in a computer-readable medium.

24. The system of claim 15, further comprising:
means for providing an error indication if it is determined that there is no signal return path in the integrated circuit design within the predetermined threshold distance from the signal via.

25. The system of claim 24, wherein the indication comprises a visual indication in a graphical representation of the integrated circuit design.

26. The system of claim 15, wherein the signal via identification means and the first proximity verification means comprise a computer program written in the Skill scripting language.

27. The system of claim 15, wherein the signal via identification means and the first proximity verification means comprise a design rule tangibly embodied in the computer-readable medium, wherein the design rule is defined according to a specification associated with an electronic design automation tool.

28. The system of claim 27, wherein the integrated circuit design includes the design rule.

29. The system of claim 15, wherein the signal return path comprises ground metal.

30. The system of claim 15, wherein the signal return path comprises power.

* * * * *

UNITED STATES PATENT AND TRADEMARK OFFICE
CERTIFICATE OF CORRECTION

| | | |
|---|---|---|
| PATENT NO. | : 6,922,822 B2 | Page 1 of 1 |
| APPLICATION NO. | : 10/199668 | |
| DATED | : July 26, 2005 | |
| INVENTOR(S) | : Mark D. Frank et al. | |

It is certified that error appears in the above-identified patent and that said Letters Patent is hereby corrected as shown below:

In column 15, line 40, in Claim 1, after "integrated" delete ",".

Signed and Sealed this

Twenty-eighth Day of July, 2009

JOHN DOLL
*Acting Director of the United States Patent and Trademark Office*